(12) United States Patent
Calo et al.

(10) Patent No.: US 11,355,429 B2
(45) Date of Patent: Jun. 7, 2022

(54) ELECTRICAL INTERCONNECT STRUCTURE WITH RADIAL SPOKES FOR IMPROVED SOLDER VOID CONTROL

(71) Applicant: Infineon Technologies AG, Neubiberg (DE)

(72) Inventors: Paul Armand Asentista Calo, Melaka (MY); Tek Keong Gan, Melaka (MY); Ser Yee Keh, Johor (MY); Tien Heng Lem, Melaka (MY); Fong Lim, Melaka (MY); Michael Stadler, Munich (DE); Mei Qi Tay, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/774,800

(22) Filed: Jan. 28, 2020

(65) Prior Publication Data

US 2021/0233839 A1    Jul. 29, 2021

(51) Int. Cl.
| | | |
|---|---|---|
| *H01L 23/48* | (2006.01) | |
| *H01L 23/498* | (2006.01) | |
| *H01L 21/48* | (2006.01) | |
| *H01L 23/00* | (2006.01) | |
| *H01L 21/60* | (2006.01) | |

(52) U.S. Cl.
CPC .... *H01L 23/49838* (2013.01); *H01L 21/4853* (2013.01); *H01L 23/49866* (2013.01); *H01L 24/05* (2013.01); *H01L 2021/60135* (2013.01); *H01L 2924/01029* (2013.01)

(58) Field of Classification Search
None
See application file for complete search history.

(56) References Cited

U.S. PATENT DOCUMENTS

| | | | |
|---|---|---|---|
| 5,410,449 A | 4/1995 | Brunner | |
| 6,201,305 B1* | 3/2001 | Darveaux | H01L 24/13 257/779 |
| 6,388,203 B1* | 5/2002 | Rinne | C08F 8/44 174/261 |
| 2006/0055034 A1* | 3/2006 | Wark | H01L 23/49811 257/734 |
| 2008/0164054 A1 | 7/2008 | Shin et al. | |
| 2009/0001138 A1 | 1/2009 | Tameerug | |
| 2011/0309454 A1* | 12/2011 | Ho | H01L 24/73 257/392 |
| 2013/0087813 A1 | 4/2013 | Yan et al. | |

* cited by examiner

*Primary Examiner* — Hung K Vu
(74) *Attorney, Agent, or Firm* — Murphy, Bilak & Homiller, PLLC

(57) ABSTRACT

An electrical interconnect structure includes a bond pad having a substantially planar bonding surface, and a solder enhancing structure that is disposed on the bonding surface and includes a plurality of raised spokes that are each elevated from the bonding surface. Each of the raised spokes has a lower wettability relative to a liquefied solder material than the bonding surface. Each of the raised spokes extend radially outward from a center of the solder enhancing structure.

10 Claims, 7 Drawing Sheets

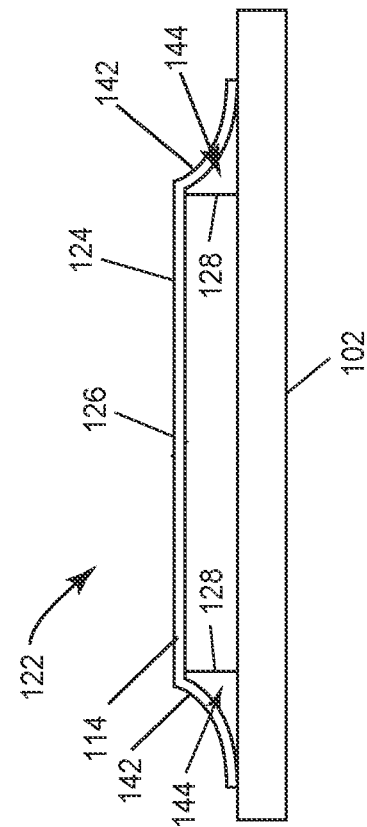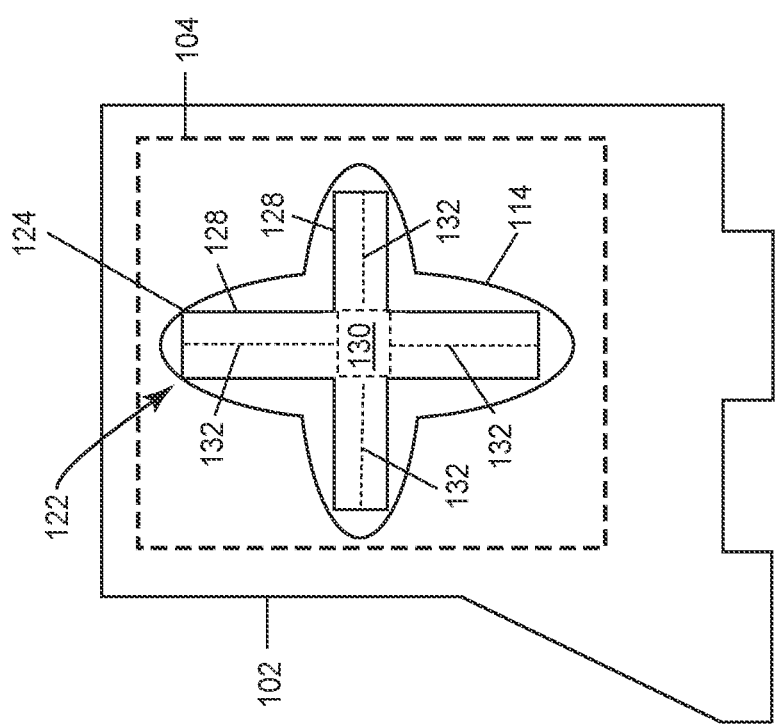
FIGURE 4

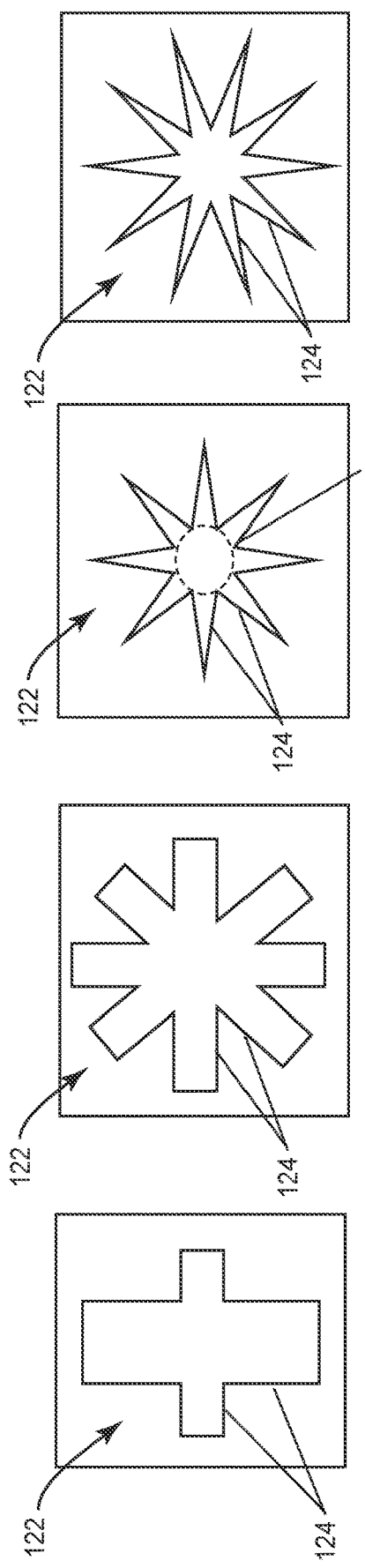
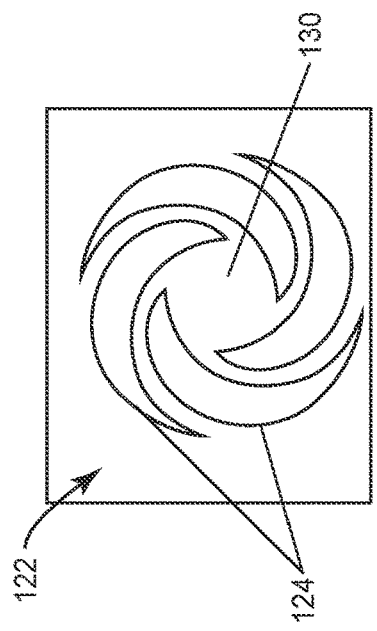

ELECTRICAL INTERCONNECT STRUCTURE WITH RADIAL SPOKES FOR IMPROVED SOLDER VOID CONTROL

BACKGROUND

Solder is commonly used in electronics to form an electrical connection between two elements, e.g., wires, bond pads, etc. In semiconductor applications, solder is used to mechanically couple and electrically connect the conductive bond pads of a semiconductor die to an external element. For example, a semiconductor die may be mounted in a flip-chip arrangement wherein the terminals of the semiconductor die are soldered to a carrier, e.g., a lead-frame, PCB (printed circuit board), etc. In another example, a semiconductor die may be mounted with a terminal facing away from the carrier, and this terminal can be soldered to a metal clip, bond wire, ribbon, etc. In either case, the solder joints are formed by a thermal cycle wherein the solder material is heated, liquefied and hardened. Modern semiconductor processing techniques involve the formation of many small footprint solder joints in parallel. In some cases, gasses may become trapped in the solder material during the formation of the solder joints. These gasses may originate from ambient air or may be the product of chemical reactions in the solder material. In either case, these gasses may become trapped in the solder material, thereby forming voids in the completed solder joint. This can create performance and reliability issues, e.g., in high density and small footprint solder joints.

SUMMARY

An electrical interconnect structure is disclosed. According to an embodiment, the electrical interconnect structure comprises a bond pad comprising a substantially planar bonding surface, and a solder enhancing structure that is disposed on the bonding surface and comprises a plurality of raised spokes that are each elevated from the bonding surface. Each of the raised spokes has a lower wettability relative to a liquefied solder material than the bonding surface. Each of the raised spokes extend radially outward from a center of the solder enhancing structure.

Separately or in combination, each of the raised spokes in the plurality comprises an upper surface and a side surface vertically extending from the bonding surface to the upper surface, the plurality of raised spokes comprises a first raised spoke and a second raised spoke, and the side surface of the first spoke diverges from the side surface of the second spoke which faces the first spoke by at least 90 degrees.

Separately or in combination, the plurality of raised spokes comprises a third raised spoke, and the side surface of the third spoke diverges from the side surface of the second spoke which faces the third spoke by at least 90 degrees.

Separately or in combination, the plurality of raised spokes further comprises third and fourth raised spokes, and the side surfaces of the each one of the first, second, third and fourth spokes is separated from the side surface of an immediately adjacent one of the first, second, third and fourth spokes by at least 60 degrees.

Separately or in combination, the center of the solder enhancing structure is an area that is elevated from the bonding surface and is continuously connected to each of the spokes.

Separately or in combination, each of the raised spokes has a substantially uniform width along a length of the raised spoke that extends from the center of the solder enhancing structure to an outer end of the raised spoke.

Separately or in combination, each of the raised spokes taper inward from the center of the solder enhancing structure to an outer end of the raised spoke.

Separately or in combination, the center of the solder enhancing structure is an area of the bonding surface that is between the raised spokes.

Separately or in combination, each of the raised spokes are arranged in a spiral pattern with respect to the center of the solder enhancing structure.

Separately or in combination, the wettability of each of the raised spokes and the bonding surface is such that a contact angle of the liquefied solder on outer surfaces of each of the spokes is at least 10 degrees greater than the contact angle of the liquefied solder on the bonding surface.

Separately or in combination, the bonding surface is a copper surface, and the outer surfaces of each of the raised spokes are silver surfaces.

Separately or in combination, the electrical interconnect structure is a lead frame, and the bonding surface is a die attach surface of the lead frame.

Separately or in combination, the electrical interconnect structure is a metal interconnect clip, and wherein the bonding surface is a die attach surface or a lead attach surface of the metal interconnect clip.

According to another embodiment, the electrical interconnect structure comprises a bond pad comprising a substantially planar bonding surface, and a solder enhancing structure that is disposed on the bonding surface and comprises a plurality of raised spokes that are each elevated from the bonding surface. Each of the spokes in the plurality of raised spokes comprises an upper surface and a side surface extending from the bonding surface to the upper surface. The plurality of raised spokes comprises a first one of the raised spokes that is configured to form a first gas channel along the side surface of the first spoke when the solder enhancing structure is covered by liquefied solder material. The plurality of raised spokes comprises a second one of the raised spokes that is configured to form a second gas channel along the side surface of the second spoke when the solder enhancing structure is covered by liquefied solder material, and the first and second gas channels at least 90 degrees apart from one another.

Separately or in combination, the plurality comprises a third one of the raised spokes that is configured to form a third gas channel along the side surface of the third spoke when the solder enhancing structure is covered by liquefied solder material and a fourth one of the raised spokes that is configured to form a fourth gas channel along the side surface of the fourth spoke when the solder enhancing structure is covered by liquefied solder material, and wherein the first, second, third and fourth spokes are arranged such that each one of the first, second, third and fourth gas channels are at least 60 degrees apart from immediately adjacent ones of the first, second, third and fourth gas channels.

Separately or in combination, the first and second spokes are configured to form the first and second gas channels, respectively, through a difference in wettability relative to the liquefied solder material between outer surfaces of each of the first and second spokes and the bonding surface.

A method of forming an electrical connection in a semiconductor device is disclosed. According to an embodiment, the method includes providing a semiconductor die comprising an electrically conductive bond pad, providing an interconnect structure, comprising: a substantially planar and electrically conductive bonding surface, and a solder enhancing structure that is disposed on the bonding surface and comprises a plurality of raised spokes that are each elevated from the bonding surface, covering the solder enhancing structure with solder material, arranging the semiconductor die such that the bond pad contacts the solder material, and performing a thermal cycle which includes a reflow phase wherein the solder material becomes liquefied. Each of the raised spokes have a lower wettability than the bonding surface, the wettability being relative to the liquefied solder material. The lower wettability of the raised spokes causes gas channels to form along side surfaces of the raised spokes during the reflow phase Separately or in combination, a meniscus forms at a transition between the bonding surface and the interconnect structure during the reflow phase, and the gas channels are formed between the side surfaces of the raised spokes and the meniscus.

Separately or in combination, the plurality of raised spokes comprises at least three of the raised spokes that each extend radially outward from a center of the solder enhancing structure, and the gas channels draw gasses away from the center of the solder enhancing structure during the reflow phase.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 4 illustrates an interconnect structure having a bonding surface with a solder enhancing structure covered by liquefied solder material, according to an embodiment.

FIG. 6, which includes FIGS. 6A, 6B, 6C, 6D and 6E, illustrates various geometries of a solder enhancing structure, according to an embodiment.

DETAILED DESCRIPTION

According to embodiments described herein, an interconnect structure includes a solder enhancing structure that advantageously improves the performance and reliability of a solder connection between a planar bonding surface of the interconnect structure and an external element. The solder enhancing structure includes a plurality of raised spokes that are elevated from the planar bonding surface of the interconnect structure. The raised spokes are configured to form gas channels in the solder material during the reflow phase of soldering. The gas channels arise between the side surfaces of the spokes and a meniscus in the reflowed (i.e., liquefied) solder material. The meniscus and hence the gas channels are caused by a difference in wettability between the raised spokes and the bonding surface of the interconnect structure, relative to the solder material. The gas channels provide a conduit for gasses to escape from the solder material during the reflow phase. The raised spokes are arranged in a radial pattern, which results in the gas channels extending radially outward from the center of the solder enhancing structure. This facilitates efficient outgassing of the solder material by drawing the gasses away from the center of the solder joint and towards the outside of the solder where it can escape. The outgassing of the solder mitigates the possibility of voids or pockets of gas in the completed solder joint. As a result, the completed solder joint has low electrical resistance and high mechanical strength.

Figure 1:
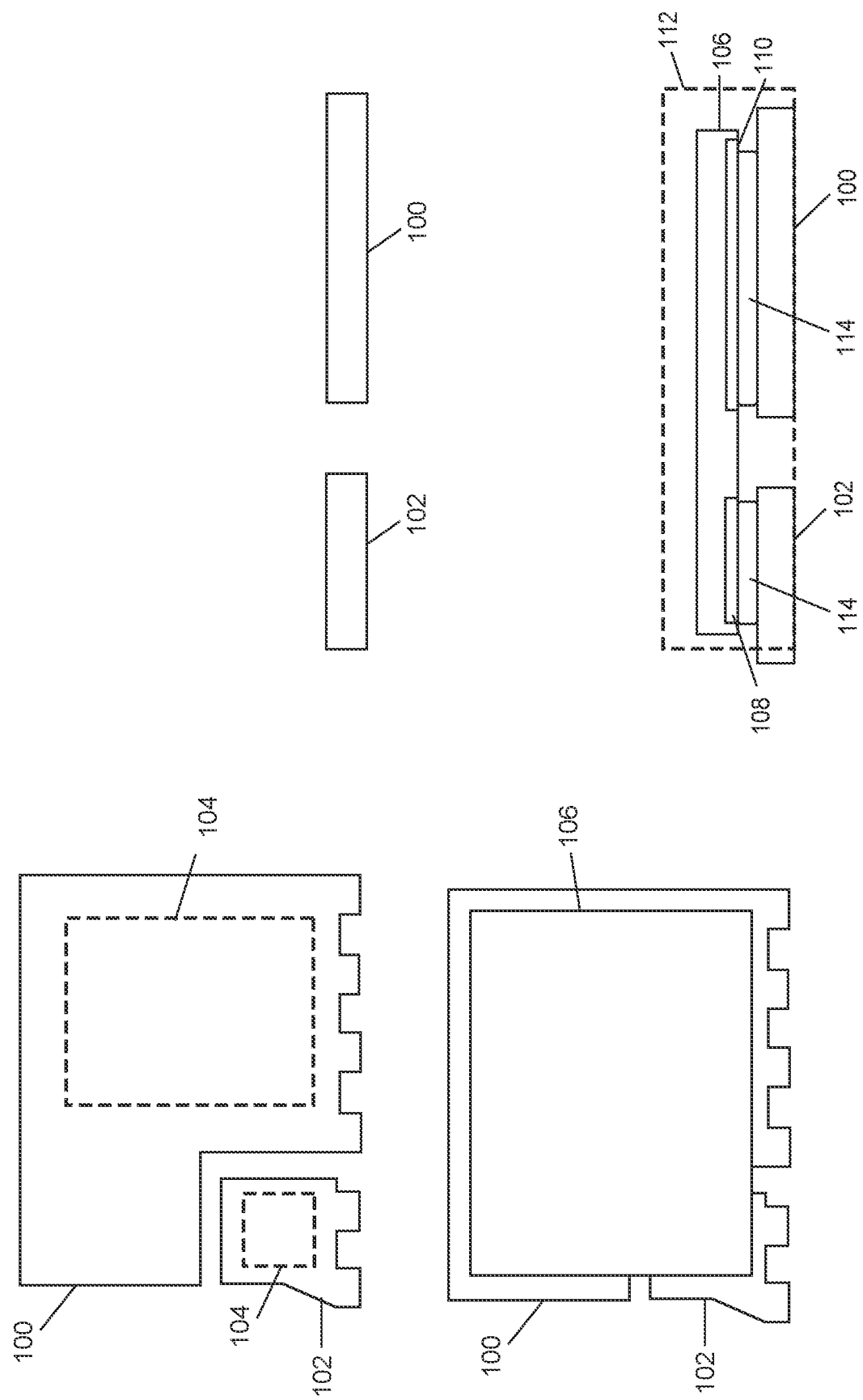
FIG. 1 illustrates a semiconductor die mounted on a lead frame in a flip-chip arrangement, according to an embodiment.

Referring to FIG. 1, a lead-frame assembly for a semiconductor package is depicted, according to an embodiment. The lead-frame assembly includes a die pad 100 and a first lead 102 that is spaced apart from the die pad 100. The die pad 100 and the first lead 102 are electrically conductive structures. Exemplary materials of the die pad 100 and the first lead 102 include conductive metals such as copper, aluminum, etc., and alloys thereof. The die pad 100 and the first lead 102 can be part of a common lead frame structure. The die pad 100 and the first lead 102 each include a die attach surface 104. Each die attach surface 104 is a substantially planar bonding surface that is configured to mate with the terminals of a semiconductor die, thereby forming an electrical connection between the two. Optionally, the die attach surfaces 104 on the die pad 100 and/or first lead 102 may have a slightly curved (e.g., convex or concave shape) that is designed to cull solder material.

The lead-frame assembly additionally includes a semiconductor die 106. The semiconductor die 106 includes first and second bond pads 108, 110 disposed on a main surface of the semiconductor die 106. The first and second bond pads 108 are electrically conductive terminals of the semiconductor die 106 (e.g., gate, source, drain, etc.). According to an embodiment, the semiconductor die 106 is a discrete MOSFET device, the first bond pad 102 is a gate terminal and the second bond pad 110 is a drain or source terminal.

The semiconductor die 106 is mounted on the lead-frame a flip-chip configuration. In this arrangement, the main surface of the semiconductor die 106 faces the lead frame such that bond pads of the semiconductor die 106 are directly electrically connected to the lead frame. Specifically, the first bond pad 108 faces and electrically connects with the first lead 102 and the second bond pad 110 faces and electrically connects with the die pad 100. Once the semiconductor die 106 is mounted and electrically connected, an electrically insulating encapsulant body 112 can be formed around the lead-frame assembly in the depicted shape, e.g., using a molding technique such as injection molding, compression molding, transfer molding, etc. The encapsulant 112 body may include ceramics, epoxy materials, thermosetting plastics, etc. In this configuration, the outer surfaces of the first lead 102 and the die pad 100 provide externally accessible contact points to the terminals of the semiconductor die 106.

The electrical connection between the semiconductor die 106 and the lead frame is effectuated by solder joints formed from solder material 114. Solder material 114 is a metal alloy which creates a permanent metallurgical bond between two metal surfaces by fusing the solder to the two metal surfaces. Fusing occurs when the solder reaches its melting point, which is lower than the melting point of the items to be joined. The completed solder joint provides both electrical conduction and a strong physical attachment between the two metal surfaces. Exemplary solder materials 114 include lead-free solder, which may be an alloy of metals such as tin, copper, silver, bismuth, indium, zinc, antimony, etc., and lead-based solder, which may be an alloy of lead and metals such as tin, silver, copper, antimony, etc. The solder material 114 may include non-metallic materials such as flux (e.g., rosin, inorganic, organic, etc.) to prevent oxidation. In one specific example, the solder material is a lead-free solder, and more specifically a solder composition of $Pb_{92.5}Sn_5Ag_{2.5}$ with a melting point in the range of 287° C. and 294° C.

According to an embodiment of a soldering technique, the solder material 114 is initially provided at room temperature, e.g., as a solder bump or ball or as a paste. The solder material 114 can be initially placed on the bond pads 108, 110 of the semiconductor die 106, the die attach surfaces 104 of the lead frame, or both. Subsequently, the semiconductor die 106 is interfaced with the lead frame such that the solder material 114 contacts the bond pads 108, 110 of the semiconductor die 106 and the die attach surfaces 104 of the lead frame. Subsequently, the assembly is subjected to a thermal cycle wherein the temperature of the solder material 114 is elevated. During a reflow phase of the thermal cycle, the temperature of the solder material 114 reaches its melting point, thereby causing liquefaction of the solder material 114. During the reflow phase, the solder material 114 chemically reacts with the joining partners to form a stable bond. Subsequently, the apparatus is cooled such that the solder material 114 hardens and forms a stable solder joint.

Figure 2:
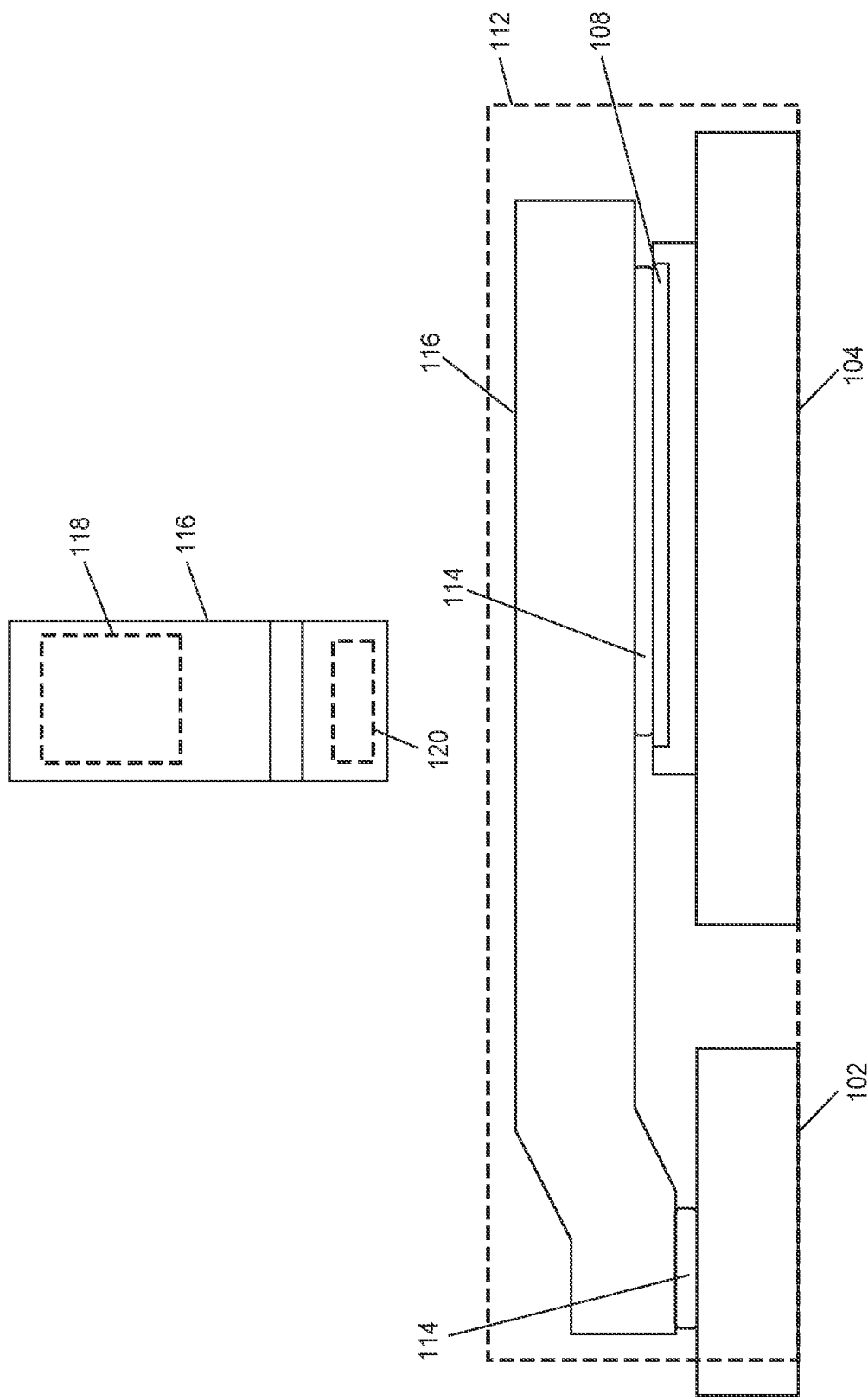
FIG. 2 illustrates a semiconductor die mounted on a lead frame with a metal interconnect clip electrically connecting the semiconductor die to a lead, according to an embodiment.

Referring to FIG. 2, a lead-frame assembly for a semiconductor package is depicted, according to another embodiment. In this embodiment, the semiconductor die 106 is mounted on the lead frame such that a main surface of the semiconductor die 106 which includes a first bond pad 108 faces away from the lead frame. In this example, the first bond pad 108 may be a source or drain terminal of the semiconductor die 106. The first bond pad 108 is electrically connected to a first lead 102 that is spaced apart from the die pad 100 by an interconnect clip 116. The interconnect clip 116 can be a substantially uniform thickness piece of metal (e.g., copper, aluminum, alloys thereof, etc.). The interconnect clip 116 includes a die attach surface 118 and a lead attach surface 120. The die attach surface 118 and the lead attach surface 120 may be substantially planar surfaces. Alternatively, the die attach surface 118 and the lead attach surface 120 may have a slightly curved (e.g., convex or concave shape) shape that is designed to cull solder material. The die attach surface 118 is electrically connected to the first bond pad 108 by solder material 114. The lead attach surface 120 is electrically connected to the first lead 102 by solder material 114. Both of these solder connections can be effectuated by the same soldering techniques described above with reference to the embodiment of FIG. 1.

One problem that may arise in any of the solder joints of the lead-frame assemblies described with reference to FIGS. 1-2 is the presence of voids in the solder material 114. These voids can be enclosed cavities or open pores that exist in the solder material 114 after the material is cooled. The voids disadvantageously increase the electrical resistance of the solder joint by decreasing the effective cross-sectional area of the conduction path. Moreover, the voids disadvantageously reduce the mechanical strength of the solder joint. The voids are attributable to gasses that arise in the solder material 114 during the solder reflow phase and are unable to escape the central volume of the solder material 114. These gaseous regions may emanate from the ambient air which becomes trapped between the elements when they are pressed together. Additionally, or alternatively, the gaseous regions may emanate from chemical reactions in the solder material 114 as it reaches higher temperatures. The likelihood and severity of the voids depends upon a variety of factors such as type of solder material, reflow temperature of the solder material, geometry of the bonding surfaces, etc. In particular, a bonding surface (e.g., a gate pad of a lead frame) may have a slightly concave shape which tends to exacerbate the problem.

Figure 3:
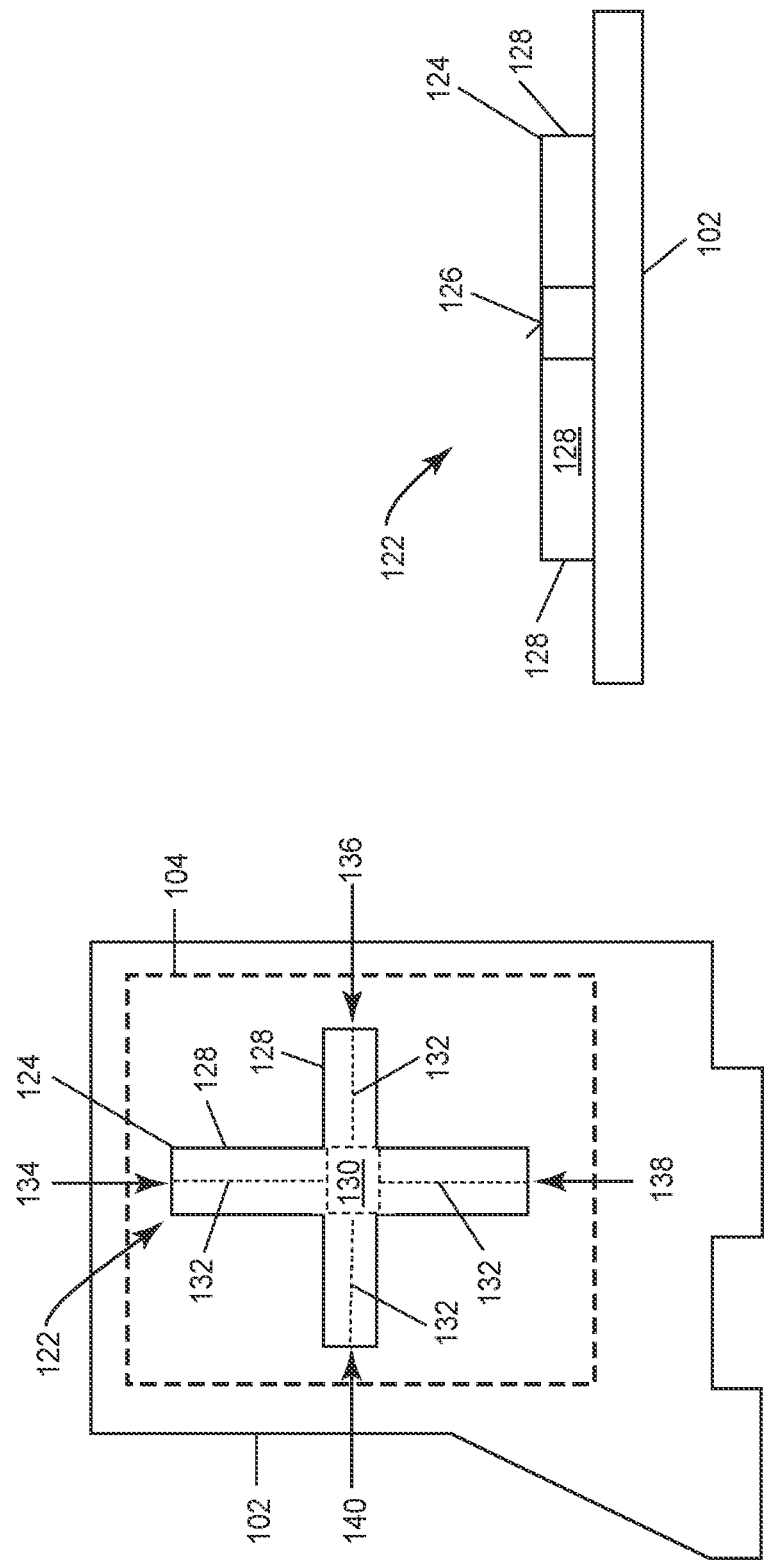
FIG. 3 illustrates an interconnect structure having a bonding surface with a solder enhancing structure, according to an embodiment.

Referring to FIG. 3, an interconnect structure with a solder enhancing structure 122 which advantageously mitigates the occurrence and/or severity of voids in a solder joint is depicted, according to an embodiment. The solder enhancing structure 122 is disposed on a substantially planar bonding surface of the interconnect structure. Generally speaking, the interconnect structure can be any electrically conductive structure which is configured to be mated with a conductive bond pad by solder. The lead frame in the embodiment of FIG. 1 illustrates one example of an interconnect structure that may include the solder enhancing structure 122, wherein the die attach surface 104 of the die pad 100 and the die attach surface 104 of the first lead 102 can be the substantially planar bonding surfaces to which the solder enhancing structure 122 is disposed on. The interconnect clip 116 in the embodiment of FIG. 2 illustrates another example of an interconnect structure that may include the solder enhancing structure 122, wherein the die attach surface 118 of the interconnect clip 116 and the lead attach surface 120 of the interconnect clip 116 can be the substantially planar bonding surfaces to which the solder enhancing structure 122 is disposed on. In another example, the interconnect structure can be a printed circuit board with conductive contact pads that are suitable bonding surfaces for the solder enhancing structure 122. For illustration purposes, the solder enhancing structure 122 is disposed on the first lead 102 of the lead frame (e.g., the gate lead) from the embodiment of FIG. 1. However, the following discussion is equally applicable to a solder enhancing structure 122 that is disposed on any one the above discussed interconnect structures.

According to an embodiment, the solder enhancing structure 122 includes a plurality (i.e., two or more) of raised spokes 124. Each of the raised spokes 124 are elevated from the bonding surface (i.e., the die attach surface 104 of the first lead 102 in the depicted example). That is, the raised spokes 124 vertically project from the bonding surface to provide an apex point or plateau above the bonding surface. For example, as shown in the side-view perspective on the right side of FIG. 3, each of the raised spokes 124 includes an upper surface 126 that is spaced apart from the bonding surface and side surfaces 128 that vertically extend from the bonding surface to the upper surface 126. In the depicted embodiment, the side surfaces 128 of the raised spoke 126 are perpendicular to the bonding surface and the upper surface 126 of the raised spoke 126 is parallel to the bonding surface. Alternatively, the side surfaces 128 can be oriented at non-perpendicular angles relative to the bonding surface and/or the upper surface 126 of the raised spoke 126, e.g. within +/−10° of perpendicular. Additionally, or alternatively, the upper surface 126 of the raised spoke 126 can be a distinct point instead of a flat surface.

Each of the raised spokes 124 extend radially outward from a center 130 of the solder enhancing structure 122. This means that the separation distance between corresponding locations on the centerlines 132 of two immediately adjacent raised spokes 124 increases moving away from the center 130 of the solder enhancing structure 122. Each of the raised spokes 124 includes an inner end that is closer to the center 130 of the solder enhancing structure 122, an outer end that is distal to the center 130 of the solder enhancing structure 122. The centerline 132 is a line that runs between the inner and outer end of the raised spoke 124 and is equidistant to the side surfaces 128 of the raised spoke 124 that run between the inner and outer end of the raised spoke 124. In the depicted embodiment, the center 130 of the solder enhancing structure 122 is a portion of the solder enhancing structure 122 that is continuously connected to each of the raised spokes 124. That is, the center 130 of the solder enhancing structure 122 and the raised spokes 124 form a singularly continuous structure, wherein each raised spoke 124 is an elongated portion which extends out from the center of the continuous structure. In that case, the center 130 of the solder enhancing structure 122 can be elevated from the bonding surface, e.g. by the same vertical height as the spokes. Alternatively, the center 130 of the solder enhancing structure 122 can be an area of the bonding surface (i.e., an area of the die attach surface 104 in the depicted example) that is between the raised spokes 124. In that case, the solder enhancing structure 122 is provided by a plurality of discrete raised spokes 124 that are disconnected from one another, and each extend out from the central area of the bonding surface that is between each raised spoke 124.

In the embodiment of FIG. 3, the solder enhancing structure 122 includes a first one 134 of the raised spokes 124, a second one 136 of the raised spokes 124, a third one 138 of the raised spokes 124, and a fourth one 140 of the raised spokes 124, each of which extend radially outward from the center 130 of the solder enhancing structure 122. In this example, the solder enhancing structure 122 has a cross-shaped geometry wherein the centerline 132 of each of the spokes 124 is approximately perpendicular to the immediately angularly adjacent spokes. Moreover, in this embodiment, each of the raised spokes 124 has a substantially uniform width along a length of the raised spoke 124 that extends from the center 130 of the solder enhancing structure 122 to the outer end of the raised spoke 124.

According to an embodiment, each of the raised spokes 124 has a lower wettability relative to a liquefied solder material 114 than the bonding surface. As used herein, the term "wettability" refers to the ability of a liquid (e.g. liquid solder) to maintain contact with a solid surface. Wettability is attributable to intermolecular forces including the cohesive forces in the liquid and the adhesive forces between the liquid and the solid surface. These intermolecular forces influence the geometry of a droplet of liquid that is applied to the solid surface. The degree of wettability is determined by a contact angle of the droplet on the sold surface. The contact angle refers to the angle at which a side surface of the liquid droplet meets the sold surface. A low or "poor" wettability results in a high contact angle (e.g., between 90° and 180°), which forms the liquid droplet on the surface in a relatively spherical shape. A high or "good" wettability results in a low contact angle (e.g., between 0° and 90°), which forms the liquid droplet on the surface in a relatively flat shape.

Referring to FIG. 4, an interconnect element is shown with solder material 114 covering the solder enhancing structure 122. The solder material 114 is in a liquefied state that occurs during the solder reflow phase. The liquefied solder material 114 includes a meniscus 142 at the transition between the bonding surface and the solder enhancing structure 122. As those having ordinary skill in the art will appreciate, a meniscus 142 refers to a curve in the outer surface a liquid caused by surface tension. The meniscus 142 is caused by the difference in wettability between the raised spoke 124 and the bonding surface. Because the liquefied solder material 114 interacts with each surface differently, the meniscus 142 arises from a difference in surface tension and cohesive forces in the liquefied solder material 114. Due to this meniscus 142, a gas channel 144 is formed between the side surfaces 128 of the raised spokes 124 and the meniscus 142 in the solder material 114. This gas channel 144 is an open region wherein the liquefied solder material 114 does not contact the raised spokes 124. The gas channel 144 forms a pathway for fluids (e.g., ambient air or gas emanating from the solder material 114) to move along the side surfaces 128 of the raised spokes 124. The gas channel 144 may form along any one or all of the side surfaces 128 of each raised spoke 124. In an embodiment, the gas channel 144 extends completely in a length direction of the raised spoke 124, i.e., from the center 130 of the solder enhancing structure 122 to the outer end of the raised spoke 124.

Figure 5:
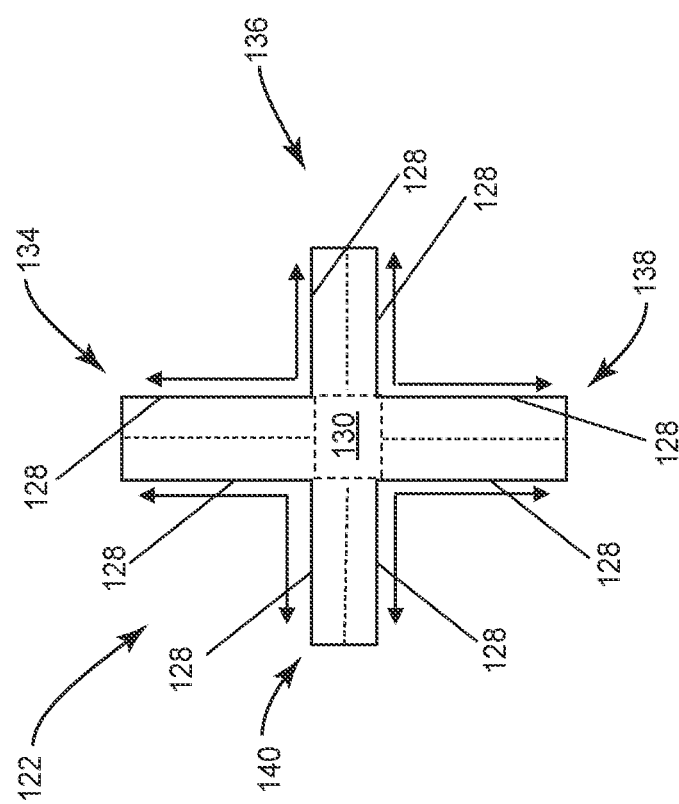
FIG. 5 illustrates the directional flow of gas in channels that form along the side surfaces of the raised spokes of a solder enhancing structure during solder reflow, according to an embodiment.

Referring to FIG. 5, the directional flow of gasses through the gas channels 144 (shown in FIG. 4) during solder reflow is depicted, according to an embodiment. As can be seen, each gas channel 144 provides a path which draws fluids along the side surfaces 128 of each of the first, second, third and fourth spokes 134, 136, 138, 140. The gas flows away from the center 130 of the solder enhancing structure 122 to the outer ends of each one of the first, second, third and fourth spokes 134, 136, 138, 140. Due to the radial arrangement of the spokes, the gas is drawn away from the interior region of the solder material, which tends to trap the gas, to the outer perimeter of the solder material, wherein the gas can escape. The gas accelerates as it moves away from the center 130 of the solder enhancing structure 122. As a result, the likelihood of enclosed voids or open-ended pores forming in the completed solder joint after cooling of the solder material 114 is substantially reduced.

Referring again to FIG. 4, the outgassing effect occurs when the gas channels 144 are present and sufficiently large to provide a clear path for the gas along the side surfaces 128 of the raised spokes 124. To this end, the difference in wettability between the raised spokes 124 and the bonding surface can be tailored to form the meniscus 142 at the appropriate profile for a given solder material 114, thereby forming an effective gas channel 144. The difference in wettability can be tailored by appropriate selection of the material composition and/or surface properties (e.g., roughness) of the raised spokes 124 and the bonding surface. The inventors have found that configuring the raised spokes 124 such that a contact angle on outer surfaces of each of the spokes (i.e., the surfaces that are exposed to the solder material 114) is at least 10 degrees greater than the contact angle of the on the bonding surface, relative to a typical liquefied solder material 114 used in semiconductor applications (e.g., $Pb_{92.5}Sn_5Ag_{2.5}$ solder at its melting point, which is in the range of 287° C. and 294°), produces a meniscus 142 with a gas channel 144 that effectively dissipates gasses to escape the solder material 114. In one embodiment which conforms to this requirement, the bonding surface is a copper surface and the outer surfaces of the raised spokes 124 are silver surfaces. More generally, the an adequate meniscus 142, and hence efficient outgassing, can be obtained using one type of metal for the bonding surface (e.g., aluminum, copper, nickel, etc. and alloys thereof) and by using a different metal for the outer surfaces of the raised spokes 124 (e.g., aluminum, copper, nickel, etc. and alloys thereof), wherein the material of the raised spokes 124 is selected to have a lower wettability than the bonding surface.

In addition to the size of the gas channels 144, the efficacy of outgassing is also dependent upon the geometry of the solder enhancing structure 122. As the spoke pattern determines the path of the gas channels 144, the geometric features of the spoke pattern can be selected for effective outgassing. Generally speaking, these geometric features include height of the raised spokes 124, length of the raised spokes 124, orientation of the raised spokes 124 relative to one another and to the center 130 of the solder enhancing structure 122, number of raised spokes 124, etc.

The height of the raised spokes 124 can be selected to produce a sufficiently large meniscus 142 to allow for effective outgassing. The height difference is measured between the bonding surface and the upper surface 126 of the raised spoke 124. According to an embodiment, the raised spokes 124 each have a height of at least 3 μm. The inventors have observed that with respect to a typical liquefied solder material used in semiconductor applications, this height difference produces a sufficiently large meniscus 142 to allow for effective outgassing.

The orientation of the raised spokes 124 can be selected to produce gas channels 144 which draw gasses away from the center of the solder joint in multiple directions. By forming multiple gas channels 144 extending in different directions, better gas flow is provided and the possibility of voids in the solder joint is reduced. Generally speaking, any geometry wherein the raised spokes 124 extend radially outward from the center 130 of the solder enhancing structure 122 will advantageously produce this result, as the divergent paths of the raised spokes 124 necessarily form gas channels 144 which draw gasses away from the center of the solder join in multiple directions.

According to an embodiment, the solder enhancing structure 122 includes at least two of the raised spokes 124, with the side surfaces 128 of the two different diverging from one another by at least 90 degrees. This arrangement provides outgassing from the center of the solder joint in two different directions, with at least two of the gas flow channels being at least 90 degrees apart from one another. This is generally more effective than just one direction, as there are more paths for gas to escape. The depicted embodiment of FIG. 5 illustrates one example of this embodiment. As can be seen, the side surface 128 of the first spoke 134 diverges from the side surface 128 of the second spoke 136 which faces the first spoke 128 by 90 degrees. As a result, two gas channels 144 diverge from one another by 90 degrees.

According to an embodiment, the solder enhancing structure 122 includes at least three of the raised spokes 124, and the three raised spokes are arranged such that each side surface 128 diverges from the side surface 128 of the immediately adjacent spoke to which it faces by at least 90 degrees. By increasing the number of gas channels 144 and increasing the radial spread of the gas channels 144 such that there is at least 180 degrees of divergence from the center of the solder joint, improved outgassing may be obtained in some circumstances in comparison to a two-channel configuration. The depicted embodiment of FIG. 5 illustrates one example of this embodiment. As can be seen, the side surface 128 of the first spoke 134 diverges from the side surface 128 of the second spoke 136 which faces the first spoke 128 by 90 degrees, and the side surface 128 of the third spoke 138 diverges from the side surface 128 of the second spoke 136 which faces the third spoke 128 (i.e., the opposite side surface 116 as the side surface 128 which faces the first spoke 134) by 90 degrees.

According to an embodiment, the solder enhancing structure 122 includes four of the raised spokes 124, and the raised spokes 124 are arranged such that each side surface 128 diverges from the side surface 128 of the immediately adjacent spoke to which it faces by at least 90 degrees. By increasing the number of gas channels 144 and increasing the radial spread of the gas channels 144 such that there is at least 240 degrees of divergence from the center of the solder joint, improved outgassing may be obtained in some circumstances in comparison to a two-channel configuration. The depicted embodiment of FIG. 5 illustrates one example of this embodiment. As can be seen, the side surfaces 128 of each of the first, second, third and fourth ones of the raised spokes 134, 136, 138 and 140 form perpendicular angles with the side surface 128 of the immediately adjacent spoke to which it faces. More generally, the raised spokes 124 may be arranged at non-perpendicular angles (e.g., as a, 'X' shape) and a similar benefit may be obtained.

Referring to FIG. 6, various geometries of the solder enhancing structure 122 are shown. In the embodiment of FIG. 6A, the solder enhancing structure 122 has a cross-shaped configuration which is substantially similar the configuration of FIGS. 3-5, except that two of the raised spokes 124 are wider than the two other raised spokes 124. In the embodiment of FIG. 6B, the solder enhancing includes eight of the raised spokes 124, each having an equal width and each raised spoke 124 diverging away from the center of the solder enhancing structure 122 at an angle of about 45 degrees, relative to the immediately adjacent raised spoke 124, As a result, the solder enhancing structure 122 has an asterisk shape. In the embodiment of FIG. 6C, the solder enhancing structure 122 includes eight of the raised spokes 124 diverging away from the center solder enhancing structure 122 in a similar manner as the embodiment of FIG. 6B. However, in this embodiment, each of the raised spokes 124 taper inward from the center 130 of the solder enhancing structure 122 to the outer end of the raised spoke 124. Specifically, the raised spokes 124 each include linear side surfaces that extend away from the center 130 of the solder enhancing structure 122 and converge at a distinct point, thereby forming a star-shaped geometry. The embodiment of FIG. 6D similarly has a star-shaped geometry but includes 10 of the raised spokes 124. In the embodiment of FIG. 6E, the raised spokes 124 are arranged in a spiral pattern, wherein each raised spoke 124 extends retreats from the center 130 of the solder enhancing structure 122 while simultaneously curving away from the center 130 of the solder enhancing structure 122. Different to the previously discussed embodiments, the center 130 of the solder enhancing structure 122 in the embodiment of FIG. 6E is an area of the bonding surface that is between the raised spokes 124. Hence, in this embodiment, the solder enhancing structure 122 is provided by a plurality of discrete and disconnected ones of the raised spokes 124.

Figure 7:
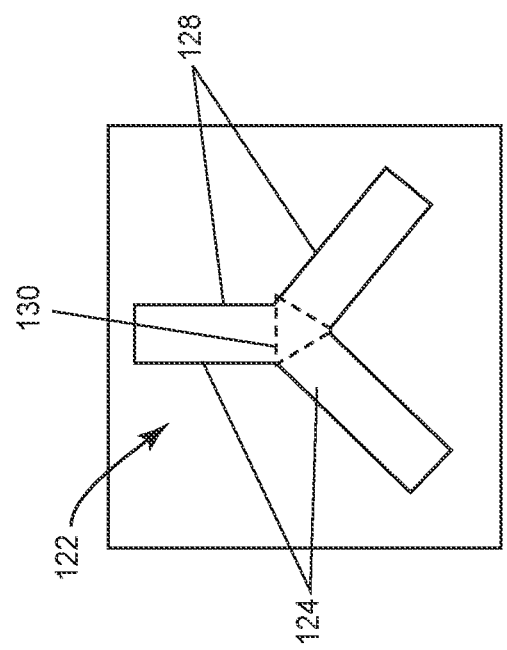
FIG. 7 illustrates a solder enhancing structure, according to an embodiment.

Referring to FIG. 7, the solder enhancing structure 122 is shown, according to another embodiment. In this embodiment, the solder enhancing structure 122 includes only three of the raised spokes 124. In this geometry, the raised spokes 124 extend radially away from the center 130 of the solder enhancing structure 122 at approximately equal angles of divergence. Specifically, as seen in the plan-view perspective, the side surfaces of two immediately adjacent raised spokes 124 (which have a uniform width in this example) that face one another diverge away from the center 130 at an angle of 120 degrees. As a result, the solder enhancing structure 122 uniformly draws liquefied solder material away from the center 130 of the solder enhancing structure 122 in three directions.

The various geometries depicted in the figures represent just some examples of spoke patterns for the effective outgassing of solder joints. The various concepts may be combined with one another. For example, other embodiments of a solder enhancing structure 122 may include a spoke pattern similar to that shown in any one of FIGS. 3-5, 6A-6D, and 7, but with an area of the bonding surface in the central region of the raised spokes 124, e.g., in a similar manner as in FIG. 6E. Generally speaking, the selection of one geometry over another may involve performance considerations. For instance, a greater number of spokes may be preferred because it increases the number of gas channels for outflow. Additionally, or alternatively, a tapered spoke pattern (e.g., as shown in FIGS. 6C-6E) may be preferred to provide a better outlet for gasses to escape. Additionally, or alternatively, a spiral pattern (e.g., as shown in FIG. 6E) may reduce bottlenecking in the gas channels 144, as the velocity of the gas tends to increase as it moves away from the center 130 of the solder enhancing structure 122. Moreover, a spiral pattern (e.g., as shown in FIG. 6E) can provide a greater density of gas channels 144 across the area of the solder joint and/or cover a larger area of the solder joint. Hence, the structure may be more effective at removal of gasses in comparison to a linear configuration, at least in some cases. On the other hand, performance considerations may be balanced against other considerations, such as cost and/or ease of manufacture. For instance, patterns with a lower number of spokes, e.g., in the spoke patterns of FIGS. 3-5 and 7, may be preferable over more complicated patterns, as this structure is generally easier to form reliably, particularly in small areas, by known metal structuring techniques.

Generally speaking, the solder enhancing structure 122 can be formed by any of a variety of metal processing techniques such as stamping, coining, punching, etc., etching, etc. According to one technique, the solder enhancing structure 122 can be formed by an etching technique wherein a substantially uniform thickness piece of conductive material (e.g., sheet metal) is provided and masked etching is used to reduce the thickness of the material in a selected region around the solder enhancing structure 122. According to another technique, the solder enhancing structure 122 can be formed by a deposition technique wherein metal is selectively deposited in exposed mask openings. The difference in wettability between the solder enhancing structure 122 and the bonding surface can be obtained by depositing a different material surface on the solder enhancing structure 122. For example, a plating process (e.g., electroless or electroplating) may be performed on the solder enhancing structure 122 before or after the above discussed etching or deposition steps. In one example of this technique, the bonding surface is a surface region of a lead frame or interconnect clip (e.g., a copper surface) and the outer surfaces of the solder enhancing structure 122 are portions that are coated with a lower wettability metal (e.g., silver).

The embodiments described herein describe a semiconductor die 106. Generally speaking, the semiconductor die 106 can have a wide variety of device configurations. These configurations include discrete device configurations such as a MOSFET (Metal Oxide Semiconductor Field Effect Transistor), an IGBT (Insulated Gate Bipolar Transistor), a JFET (Junction Field Effect Transistor), a diode, etc. These configurations additionally may include integrated circuit configurations such as amplifiers, controllers, processors, etc. These device configurations include type V semiconductor technologies, e.g., silicon, silicon germanium, silicon carbide, etc., and type III-V semiconductor technologies, e.g., gallium nitride, gallium arsenide, etc. These device configurations include vertical configurations wherein the semiconductor die 106 is configured to control a current flowing between opposite facing upper and lower surfaces of the die, and lateral configuration wherein the semiconductor die 106 is configured to control a current flowing parallel to an upper surface 126 of the die.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electrical interconnect structure, comprising:
   a bond pad comprising a substantially planar bonding surface; and
   a solder enhancing structure that is disposed on the bonding surface and comprises a plurality of raised spokes that are each elevated from the bonding surface,
   wherein each of the raised spokes has a lower wettability relative to a liquefied solder material than the bonding surface,
   wherein each of the raised spokes extend radially outward from a center of the solder enhancing structure, and
   wherein each of the raised spokes taper inward from the center of the solder enhancing structure to an outer end of the raised spoke.

2. An electrical interconnect structure, comprising:
   a bond pad comprising a substantially planar bonding surface; and a solder enhancing structure that is disposed on the bonding surface and comprises a plurality of raised spokes that are each elevated from the bonding surface, wherein each of the spokes in the plurality comprises an upper surface and a side surface extending from the bonding surface to the upper surface, wherein the plurality of raised spokes comprises a first one of the raised spokes that is configured to form a first gas channel along the side surface of the first spoke when the solder enhancing structure is covered by liquefied solder material, wherein the plurality of raised spokes comprises a second one of the raised spokes that is configured to form a second gas channel along the side surface of the second spoke when the solder enhancing structure is covered by liquefied solder material, and wherein the first and second gas channels at least 90 degrees apart from one another.

3. The electrical interconnect structure of claim 2, wherein the plurality comprises a third one of the raised spokes that is configured to form a third gas channel along the side surface of the third spoke when the solder enhancing structure is covered by liquefied solder material and a fourth one of the raised spokes that is configured to form a fourth gas channel along the side surface of the fourth spoke when the solder enhancing structure is covered by liquefied solder material.

4. The electrical interconnect structure of claim 3, wherein the center of the solder enhancing structure is an area that is elevated from the bonding surface and is continuously connected to each of the spokes.

5. The electrical interconnect structure of claim 3, wherein each of the raised spokes has a substantially uniform width along a length of the raised spoke that extends from the center of the solder enhancing structure to an outer end of the raised spoke.

6. The electrical interconnect structure of claim 3, wherein each of the raised spokes taper inward from the center of the solder enhancing structure to an outer end of the raised spoke.

7. The electrical interconnect structure of claim 3, wherein the bonding surface is a copper surface, and wherein the outer surfaces of each of the raised spokes are silver surfaces.

8. The electrical interconnect structure of claim 3, wherein the electrical interconnect structure is a lead frame, and wherein the bonding surface is a die attach surface of the lead frame.

9. The electrical interconnect structure of claim 3, wherein the electrical interconnect structure is a metal interconnect clip, and wherein the bonding surface is a die attach surface or a lead attach surface of the metal interconnect clip.

10. The electrical interconnect structure of claim 2, wherein the first and second spokes are configured to form the first and second gas channels, respectively, through a difference in wettability relative to the liquefied solder material between outer surfaces of each of the first and second spokes and the bonding surface.

* * * * *

UNITED STATES PATENT AND TRADEMARK OFFICE
CERTIFICATE OF CORRECTION

PATENT NO. : 11,355,429 B2
APPLICATION NO. : 16/774800
DATED : June 7, 2022
INVENTOR(S) : P. Calo et al.

It is certified that error appears in the above-identified patent and that said Letters Patent is hereby corrected as shown below:

In the Claims

Column 13, Line 17 (Claim 2) please change "channels at" to -- channels are at --

Signed and Sealed this
Ninth Day of August, 2022

Katherine Kelly Vidal
*Director of the United States Patent and Trademark Office*